United States Patent [19]

Ohtani et al.

[11] Patent Number: 4,923,054
[45] Date of Patent: May 8, 1990

[54] WAFER TRANSFER APPARATUS HAVING AN IMPROVED WAFER TRANSFER PORTION

[75] Inventors: Masami Ohtani; Masami Nishida, both of Kyoto, Japan

[73] Assignee: Dainippon Screen Mfg. Co., Ltd., Japan

[21] Appl. No.: 275,525

[22] Filed: Nov. 22, 1988

[30] Foreign Application Priority Data

Nov. 27, 1987 [JP] Japan .................. 62-181716[U]

[51] Int. Cl.$^5$ .............................................. B65G 1/07
[52] U.S. Cl. ....................................... 187/25; 414/331; 414/609
[58] Field of Search ............... 414/331, 416, 417, 608, 414/609; 187/8.43, 25

[56] References Cited

U.S. PATENT DOCUMENTS

| 4,676,709 | 6/1987 | Bonora et al. | 414/608 X |
| 4,724,874 | 2/1988 | Parikh et al. | 414/608 X |
| 4,770,590 | 9/1988 | Hugues et al. | 414/331 X |
| 4,775,281 | 10/1988 | Prentakis | 414/331 X |
| 4,818,169 | 4/1989 | Schram et al. | 414/331 |

FOREIGN PATENT DOCUMENTS

| 56-116630 | 9/1981 | Japan . |
| 59-201782 | 11/1984 | Japan . |
| 63-128731 | 8/1988 | Japan . |

Primary Examiner—David A. Bucci
Attorney, Agent, or Firm—Ostrolenk, Faber, Gerb & Soffen

[57] ABSTRACT

An apparatus for storing and transferring a wafer. The apparatus includes a wafer transfer portion having a path through which a wafer can be transferred; structure for storing the wafer, the structure for storing the wafer being removably attached to the wafer transfer portion; a first elevator for elevating and lowering the wafer transfer portion and the storing structure to a predetermined level; a holder for temporarily holding the wafer in the wafer transfer portion; and a second elevator for elevating and lowering the wafer holder, the second elevator being separate and independent from the first elevator. Since the wafer storing structure and the wafer transfer portion are elevated and lowered by different elevators, the wafer can be transported while the wafer transfer portion is stationary. Thus, the apparatus has a simplified construction and replacement of the storing structure can be automated.

15 Claims, 6 Drawing Sheets

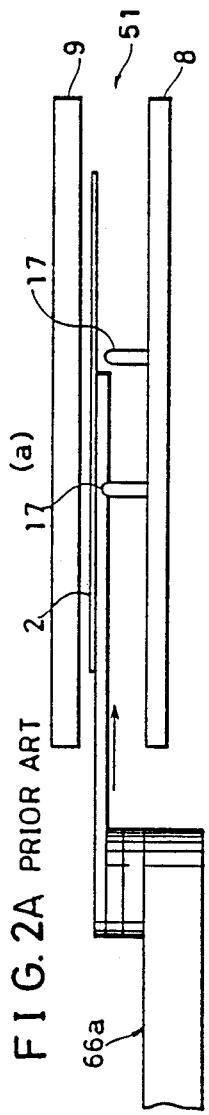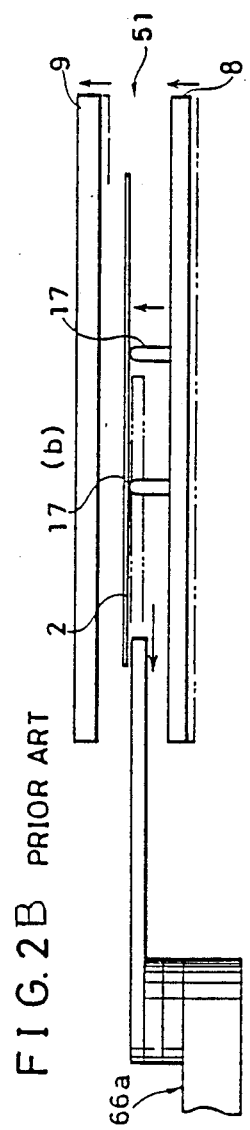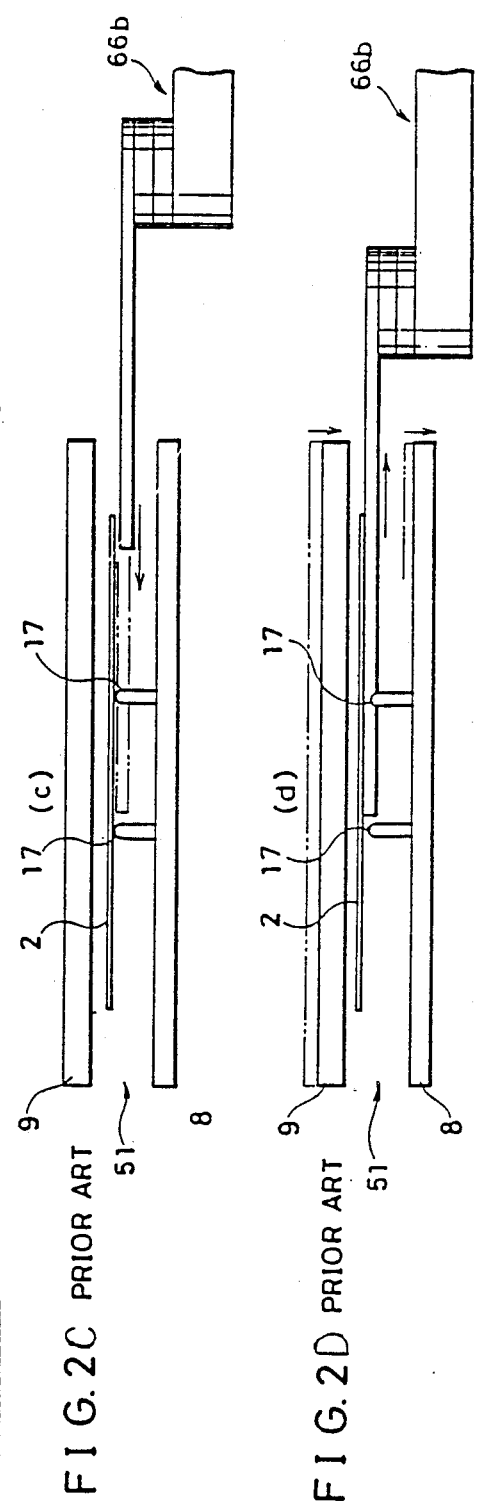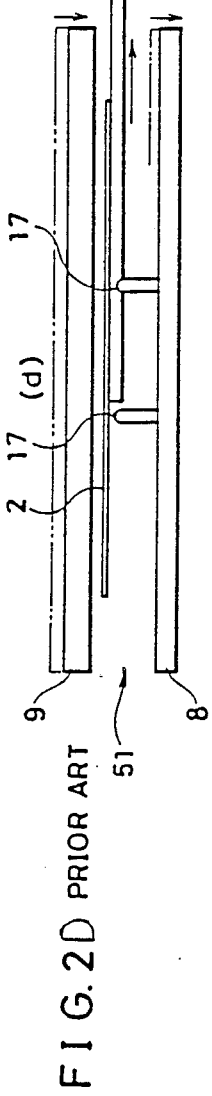
FIG. 2A PRIOR ART
FIG. 2B PRIOR ART
FIG. 2C PRIOR ART
FIG. 2D PRIOR ART

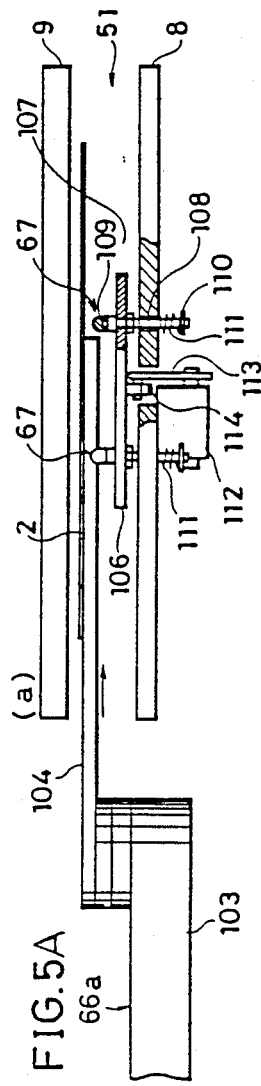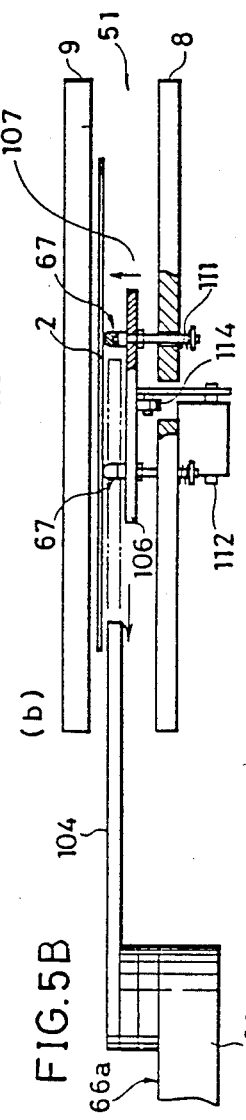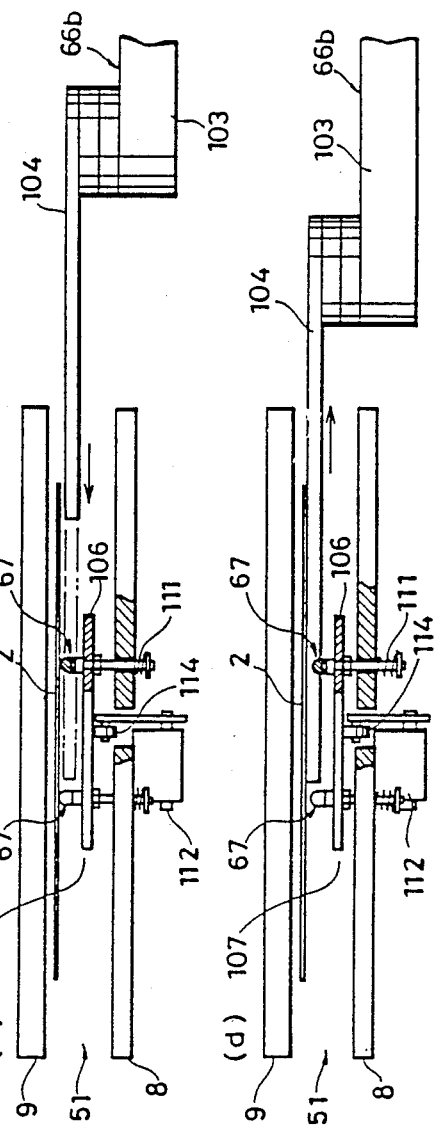

WAFER TRANSFER APPARATUS HAVING AN IMPROVED WAFER TRANSFER PORTION

BACKGROUND OF THE INVENTION

1. Field of the Invention

The present invention relates to an apparatus for transferring thin workpieces such as semiconductor wafers (hereinafter referred to as wafers). The apparatus can be used in a system for manufacturing such wafers. The invention particularly relates to a wafer transfer apparatus having a wafer transfer portion which is capable of supporting a wafer storing case, for carrying and temporarily storing wafers.

2. Description of the Prior Art

An apparatus of interest is disclosed in Japanese Utility Model Laying-Open Gazette No. 128731/1988. FIG. 1 is a perspective view of a wafer transfer portion of the apparatus described in this prior art.

The wafer transfer portion 51 to which wafers are fed includes a support frame 54, a bottom plate 8, spacers 55 and a top plate 9. The bottom plate 8 is fixed on the support frame 54 and includes three support protrusions 17 nearly at its center for placing a wafer 2 thereon. The spacers 55 are fixed on the upper surface of the bottom plate 8. The top plate 9 is coupled to the bottom plate 8 in an openable and closable manner as illustrated in FIG. 1 by the line B through the spacers 55. The bottom plate 8, the spacers 55 and the top plate 9 define a space through which wafers 2 can pass therethrough.

The wafer transfer portion 51 is supported and moved up and down by an elevating means. The elevating means includes a drive screw 61 and a pair of support rods 62. The support rods 62 pass through holes located in the support frame 54. The drive screw 61 is engaged with a threaded hole in the support frame 54. The drive screw 61 is rotated by a drive motor (not illustrated in FIG. 1) whereby the wafer transfer portion 51 is elevated or lowered.

Wafers are transported into and from the wafer transfer portion 51 by wafer feed means and wafer discharge means (not illustrated in FIG. 1).

A wafer cassette can be mounted upon the top plate 9. The wafer cassette moves up and down together with the wafer transfer portion 51.

Referring to FIGS. 2(a)–(d), to transfer wafers, the wafer transfer portion 51 is positioned at a predetermined level by the elevating means. As illustrated in FIG. 2(a), a wafer 2 is fed into the wafer transfer portion 51 by wafer feed means 66a. Referring to FIG. 2(b), the wafer transfer portion 51 is raised by the elevating means. The support protrusions 17 move upward and the respective top ends thereof support and raise the wafer 2. Then, the wafer feed means 66a returns outside the wafer transfer portion 51.

Referring to FIG. 2(c), wafer discharge means 66b moves into the wafer transfer portion 51.

Referring to FIG. 2(d), when a leading end of the wafer discharge means 66b comes near a position under the center of the wafer 2, the wafer transfer portion 51 is lowered by the elevating means. Then, the protrusions 17 lower so that the wafer discharge means 66a receives the wafer 2. After that, the wafer discharge means 66b carries the wafer 2 outside the wafer transfer portion 51 and the transfer of the wafer 2 is completed.

Now, the method of storing wafers 2 in a wafer cassette will be described. The wafer transfer portion 51 is lowered by the elevating means, so that the wafer cassette is positioned at a predetermined level. Then, the wafer 2 is placed in the wafer cassette by the wafer feed means 66a.

To take the wafers 2 out of the wafer cassette, the wafer transfer portion 51 is lowered by the elevating means until the wafer cassette is positioned at a predetermined level. Then, the wafer feed means 66a takes out one of the wafers 2 from the wafer cassette. The wafer transfer portion 51 is then positioned at a predetermined level for normal transfer of wafers and then wafers are transferred normally. If there are still wafers to be taken out from the cassette, the above described operation is repeated.

The above described convention apparatus uses a mechanical means for transporting wafers, which does not have the problems of dust or the like which occur when wafers are transported by air currents.

One of the disadvantages with the conventional apparatus is that it is not easy to automate wafer cassette replacement. This is because the wafer cassette is placed on the wafer transfer portion and moves upward and downward together with the wafer transfer portion as wafers are transferred.

Another disadvantage is that the apparatus' elevating and lowering mechanism is complicated. The elevations and lowering mechanism is complicated because it must perform each of the various tasks of feeding wafers to the wafer transfer portion, storing wafers in the cassette, and taking out wafers from the cassette.

SUMMARY OF THE INVENTION

Therefore, an object of the present invention to provide a wafer transfer apparatus making it possible to easily automate replacement of wafer storing cases.

Another object of the present invention is to provide a wafer transfer apparatus which is capable of transferring wafers easily and reliably.

Still another object of the present invention is to provide a wafer transfer apparatus which has a simple construction.

The above described objects of the invention can be accomplished by constructing a wafer transfer apparatus as described below.

The invention is directed toward an apparatus for storing and transferring a wafer. The apparatus includes a wafer transfer portion having a path through which a wafer can be transferred; storing means for storing the wafer, the storing means being removably attached to the wafer transfer portion; first elevating means for elevating and lowering the wafer transfer portion and the storing means to position the wafer transfer portion and the storing means at a predetermined level; wafer holding means for temporarily holding the wafer in the wafer transfer portion; and second elevating means for elevating and lowering the wafer holding means, the second elevating means being separate and independent from the first elevating means.

In the wafer transfer apparatus this constructed, only the wafer holding member is raised or lowered at the time of transfer or wafers. At this time, since the wafer transfer member is fixed, the operation of removing the wafer storing case from the wafer transfer member and the operation of attaching another wafer storing case to the wafer transfer member can be performed easily. As a result, replacement of wafer storing cases can be easily automated in the wafer transfer apparatus.

According to a preferred embodiment of the invention, the wafer holding member has its upper surface provided with a plurality of support protrusions, top ends of which hold the wafer. The plurality of support protrusions include three support protrusions, top ends of which are maintained at the same level. The wafer holding member elevator raises and lowers the top ends of the three support protrusions with these top ends being maintained at the same level.

Since the wafer transfer member is constructed as described above, the wafer holding member holds the wafer stably and the wafer can be transferred easily between the wafer feed device or the wafer discharge device and the wafer holding member. Thus, the wafer transfer apparatus is capable of transferring wafers easily and reliably.

According to a further preferred embodiment of the invention, the wafer holding member comprises a member for keeping the top ends of the three support protrusions at an equal height, an elevator for lifting the member, and a device for driving the elevator. The elevator for lifting the wafer holding member is separate from the elevator for lifting the wafer transfer portion.

Thus, the wafer holding member can be raised or lowered in a simple construction. Thus, the wafer transfer apparatus has a simple construction.

The foregoing and other objects, features, aspects and advantages of the present invention will become apparent from the following detailed description of the present invention when taken in conjunction with the accompanying drawings.

BRIEF DESCRIPTION OF THE DRAWING(S)

FIG. 1 is a partial fragmentary view of a conventional wafer transfer apparatus.

FIGS. 2a-d are cross-sectional views of the apparatus in FIG. 1, to illustrate its operation.

Figure 3:
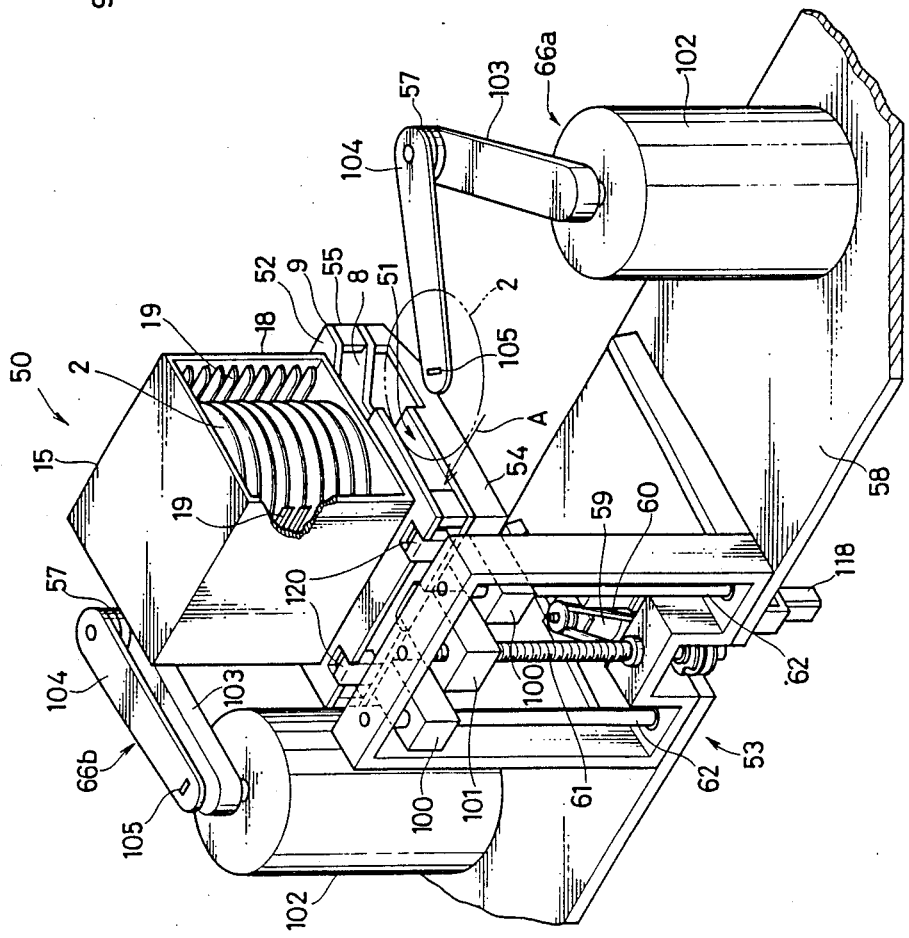
FIG. 3 is a perspective view of a wafer transfer apparatus in accordance with the present invention.

FIGS. 5a-d are partial, fragmentary, sectional views of the apparatus illustrated in FIG. 3, to illustrate its operation.

Figure 6:
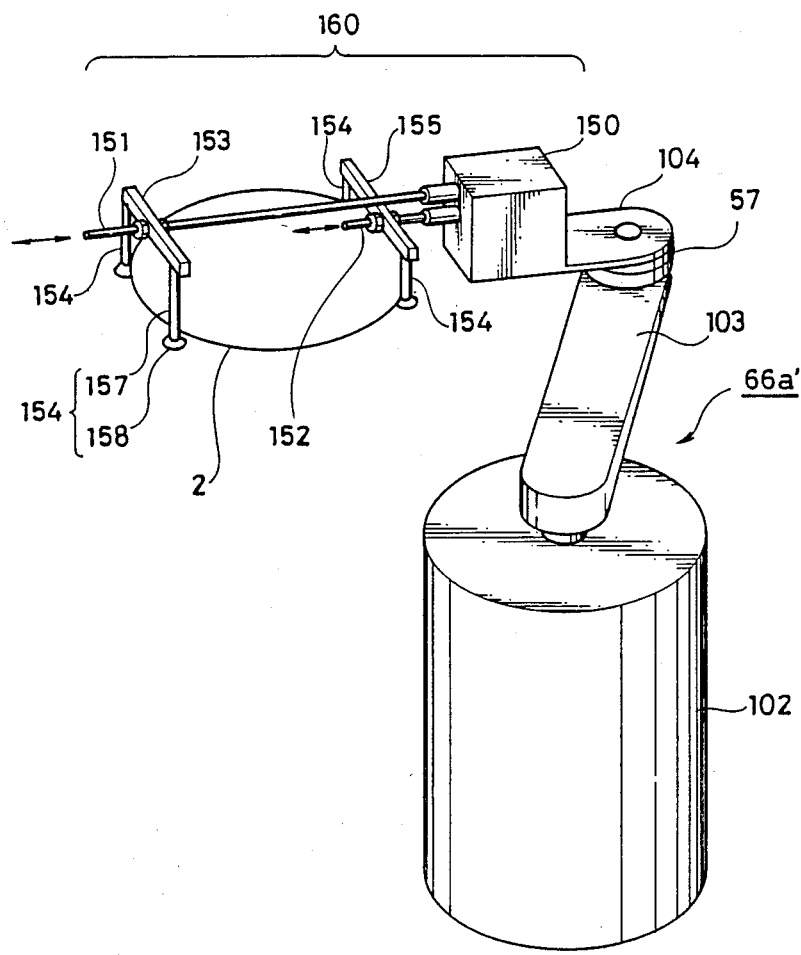

FIG. 6 is a perspective view of a transport means in accordance with another embodiment of the present invention.

Figure 7:
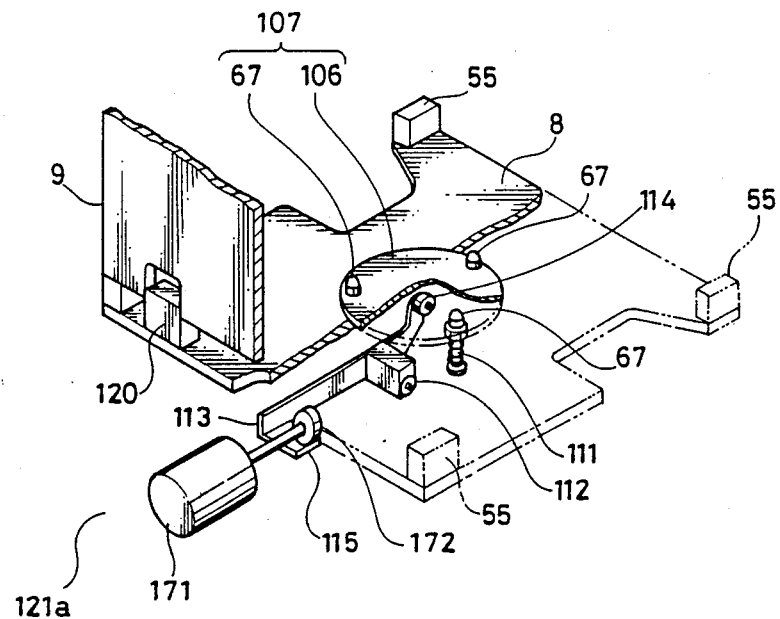

FIG. 7 is a partial, fragmentary, perspective view of an elevating means of the embodiment of FIG. 6.

Figure 8:
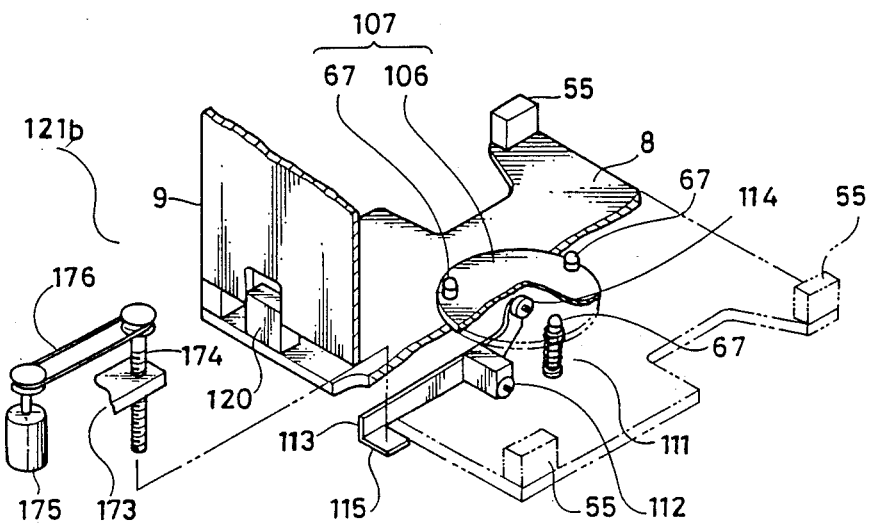

FIG. 8 is a partial fragmentary perspective view of an elevating means in accordance with a further embodiment of the present invention.

DESCRIPTION OF THE PREFERRED EMBODIMENTS

Figure 1:
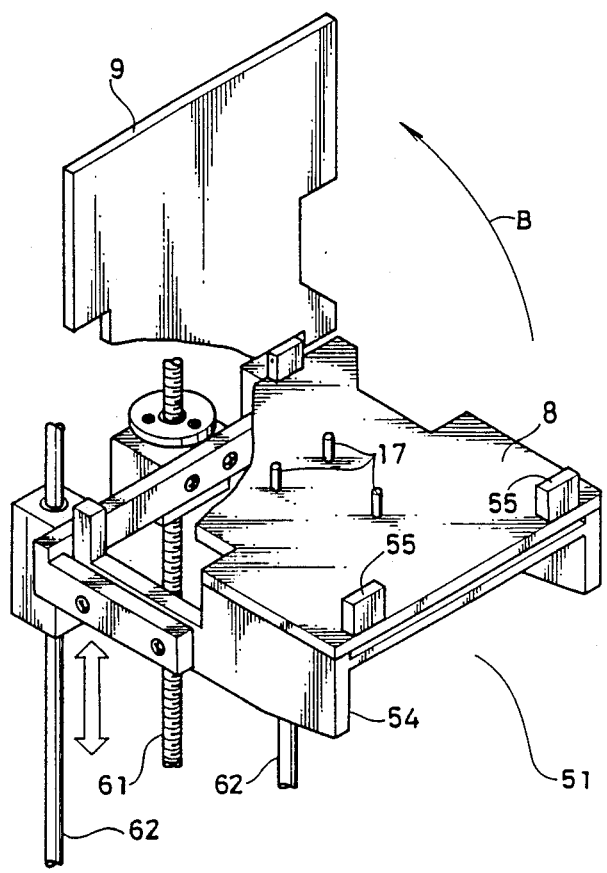
Figure 4:
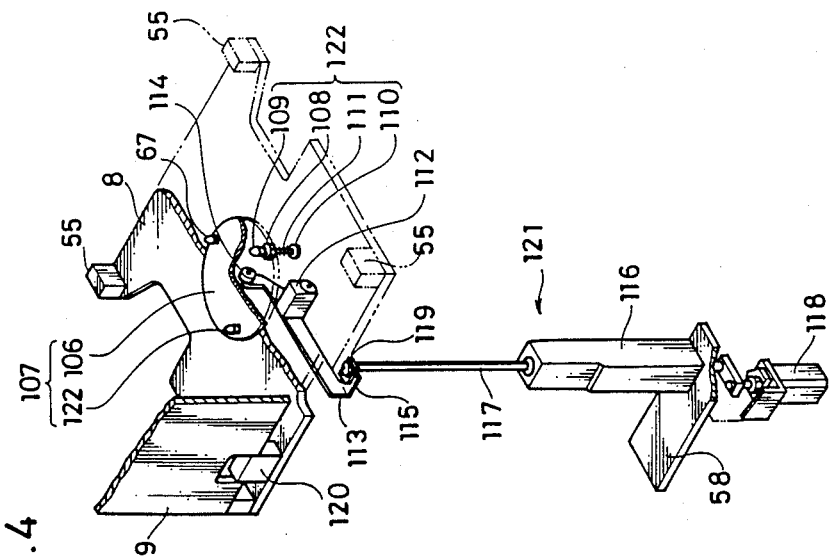
FIG. 4 is a partial, fragmentary, perspective view of the apparatus illustrated in FIG. 3.

Referring to FIGS. 3 and 4, the wafer transfer apparatus 50 includes a wafer transfer portion 51 forming a path through which wafers pass, wafer storing means such as a wafer cassette 15, means 53 for elevating the wafer transfer portion, wafer feed means 66a, wafer discharge means 66b, wafer holding means, such as a wafer holding member 107, and means for elevating the wafer holding member. Wafers 2 move on a transport path A.

The wafer transfer portion 51 includes a support frame 54, a bottom plate 8 having a plurality of holes, spacers 55, and a top plate 9. The support frame 54 includes a member 101 having a hole with a female screw portion on its inner wall, and a pair of members 100 each having a hole therethrough. The bottom plate 8 is fixed on the support frame 54 and has a hole through its center and three holes. The three holes are not aligned. The top plate 9 is attached to the bottom plate 8 in an openable and closable manner through a hinge 120. The bottom plate 8, the spacers 55 and the top plate 9 form a path through which wafers 2 move.

The wafer cassette 15 is detachably mounted on a wafer cassette base 52 on the wafer transfer portion 51. The wafer cassette 15 includes a rectangular hollow case 18 having one face opened, and wafer support means, such as pairs of elongated members 19 on two opposed inner side surfaces of the hollow case 18. Each pair 4 of elongated members 19 have upper surfaces which are of the same height and on which a wafer 2 can be placed.

The elevating means 53 includes elevation drive means, drive screw means such as a drive screw 61, and wafer transfer portion support means. The drive means includes a drive motor 59 and a transmission belt 60. The support means includes a pair of guide rods 62 for regulating horizontal movement of the wafer transfer portion. The transmission belt 60 is coupled to the drive motor 59 and the drive screw 61 so that rotation of the drive motor 59 is transmitted to the drive screw 61. The drive screw 61 is rotatably mounted on a base 58. The drive screw 61 is engaged with the hole of the member 101. A pair of support guide rods 62 penetrate through the holes of the members 100 and are fixed on the base 58. The support guide rods 62 and the drive screw 61 support the wafer transfer portion 51 and the wafer transfer portion 51 is raised or lowered by rotation of the rotation of the drive screw 61.

The wafer feed portion 66a and the wafer discharge portion 66b each include an arm drive motor 102, a first arm 103, a second arm 104, a regulation belt 57 and an air inlet opening 105. Each arm drive motor 102 is fixed on the base 58. An end of each first arm 103 is fixed to a rotation shaft of the corresponding arm drive motor 102. Each second arm 104 is coupled to the other end of the corresponding first arm 103 through the corresponding regulation belt 57. The second arm 104 rotates in a direction opposite to that of the first arm 103. Each air inlet opening 105 is provided on an upper surface of the corresponding second arm 104 near its top end to adhere to and hold the lower surface of a wafer 2.

The wafer holding member 107 comprises means for maintaining three support protrusions at equal heights. In the preferred embodiment the maintaining means is a disc 106 having three holes near its outer circumference, the three support protrusions 67 on which a wafer 2 is to be placed, and means for mounting the disc 106 in a vertically movable manner on the bottom plate 8 of the wafer transfer portion 51 and normally biasing the disc 106 downward.

The biasing means includes three members 122. Each of the members 122 includes a screw shaft 108, a cover 109 of soft resin or the like, a spring bearing 110 and a spring 111. Each screw shaft 108 penetrates through a hole of the disc 106 and the corresponding hole of the bottom plate 8. A top end of each screw shaft 108 projects from the upper surface of the disc 106. The cover members 109 cover the top ends and are used as the wafer support protrusions 67. A lower end of each screw shaft 108 projects under the bottom plate 8. The portion which projects under the bottom plate 8 is provided with the spring 111 and the spring bearing 110 to normally bias the disc 106 downward.

The means for elevating the wafer holding member includes elevation drive means such as an elevation drive portion 121, and means for elevating the means for maintaining the support protrusions at equal heights. This elevating means is a lever mechanism in the preferred embodiment. The lever mechanism includes a bearing member 112, an arm 113, a contact plate 115 and a roller 114. The bearing member 112 is fixed to the lower surface of the bottom plate 8. The arm 113 has its central portion movably attached to the bearing member 112. The roller 114 is rotatably attached to an end of the arm 113. The roller 114 contacts a central portion of the lower surface of the disc 106 through the hole at the center of the bottom plate 8. The contact plate 115 is attached to the other end of the arm 113.

The elevation drive portion 121 includes an air cylinder 118, a guide member 116, drive coupling means such as an elevating rod 117 and a presser plate 119. The guide member 116 is fixed on the base 58. The elevating rod 117 penetrates the guide member 116 and the base 58. The air cylinder 118 is fixed to the lower surface of the base 58 and coupled to a lower end of the elevating rod 117. The presser plate 119 is fixed to an upper end of the elevating rod 117. The presser plate 119 contacts the top of the contact plate 115.

When the air cylinder 118 is extended, the disc 106 is lowered by the energizing force of the spring 111. When the air cylinder 118 is contracted, the elevating rod 117 moves downward. The presser plate 119 also moves downward to push the contact plate 115 downward. As a result, by operating the arm 113 as a lever about the bearing member 112, the roller 114 is raised to lift the disc 106. When the air cylinder 118 is expanded, the disc 106 is lowered by the springs 111.

Now, the method of transferring wafers 2 in the wafer transfer apparatus illustrated in FIGS. 3 and 4 will be described. Referring to FIG. 5(a), the wafer holding member 107 is in a lowered position. The second arm 104 moves into the wafer transfer portion 51 while maintaining the wafer 2 on the upper surface of its leading end. The second arm 104 positions the wafer 2 over the wafer holding member 107.

As illustrated in FIG. 5(b), the elevating means pushes the disc 106 upward. As a result, the support protrusions 67 are raised together to hold the wafer 2. After that, the second arm 104 of the wafer feed portion 66a is returned to a predetermined position outside the wafer transfer portion 51.

Referring to FIG. 5(c), the second arm 104 of the wafer discharge portion 66b moves into the wafer transfer portion 51 and stops at a position where its leading edge is placed under a central portion of the wafer 2.

Referring to FIG. 5(d), the elevating means lowers the wafer holding member 107 so that the wafer 2 is received by the leading end of the second arm 104. The second arm 104 moves outside the wafer transfer portion 51 with the wafer 2 held on its leading end and delivers the wafer 2 for a succeeding process.

The method of storing wafers 2 in the wafer cassette 15 and taking the wafers 2 out of the cassette 15 is the same as in the prior art. More specifically, when a wafer 2 is to be stored in the wafer cassette 15, the wafer cassette 15 is lowered to a predetermined position by the elevation drive motor 59 (FIG. 3). The second arm 104 of the wafer feed portion 66a holds the wafer 2 on its leading end and moves it to a predetermined position in the wafer cassette 15. Then, the wafer transfer portion 51 is raised so that the wafer is held on the upper surfaces of the elongate members 19.

When a wafer 2 is to be taken out of the wafer cassette 15, the cassette 15 is lowered to a predetermined position by the elevation drive motor 59. Subsequently, the second arm 104 of the wafer feed portion 66a moves into the cassette 15 and stops under the stored wafer 2. The wafer transfer portion 51 is lowered so that the second arm 104 receives the wafer 2. After that, the second arm 104 is returned to a predetermined position outside the wafer cassette 15.

The, the wafer transfer portion 51 is raised by the elevation drive motor 59 so as to be at the same level as the transport path A. The, the normal wafer transfer operation is performed.

If there are further wafers 2 to be taken out from the cassette 15, the above described operation is repeated.

Since the elevation drive portion 121 can be separated upward from the lever mechanism, raising or lowering of the wafer transfer portion 51 is not obstructed.

The present invention is not limited to the above described embodiment. For example, the apparatus may include a wafer feed portion 66a' as illustrated in FIG. 6. The wafer feed portion 66a' includes an arm drive motor 102, a first arm 103, a regulation belt 57, a second arm 104 and a wafer holding unit 160. An end of the first arm 103 is fixed to a rotation shaft of the motor 102. An end of the second arm 104 is fixed to the other end of the first arm 103 through the regulation belt 57. The wafer holding unit 160 fixed to the leading end of the second arm 104 includes an upper rod 151, a lower rod 152, a frame 153, a frame 155, four contact pieces 154 and a rod drive portion 150. The frame 153 is fixed to the top end of the upper rod 151 and the frame 155 is fixed to the top end of the lower rod 152. Two contact pieces 154 are fixed to each of the frame 153 and the frame 155. Each contact piece 154 includes, for example, a bar 157 and a conical piece 158 fixed to the end of the bar 157. The height of each conical piece 158 is set slightly lower than the level of the transport path A for wafers 2 and the height of each of the frames 153 and 155 is set slightly higher than that of the transport path A for wafers 2.

Referring to FIG. 6, operation of the wafer feed portion 66a' will be described. The rod drive portion 150 extends the upper rod 151 and at the same time retracts the lower rod 152 so that a sufficiently long distance is obtained between the four contact pieces 154 to enable the wafer 2 to pass between the frames 153 and 155 without touching the contact pieces 154. Subsequently, the first arm 103 and the second arm 104 rotate by the arm drive motor 102 to position the wafer holding unit 160 with the wafer 2 being surrounded by the four contact pieces 154. After that, the rod drive portion 150 retracts the upper rod 151 and at the same time extends the lower rod 152, so that the four contact pieces 154 hold the wafer 2.

In order to release the wafer 2 from the wafer holding unit 160, the above described procedure is reversed. The same applies to the wafer discharge portion.

The means for transporting wafers 2 is not limited to the bending arm mechanism described above. For example, a moving member guided by a rail may be adopted for use with the transporting means.

FIG. 7 is a perspective view of an elevation drive portion 121a according to another embodiment. The drive portion 121a includes a drive motor 171 and a disc-shaped cam body 172. The drive motor 171 is fixed to the base 58. The rotation shaft of the motor 171 is horizontal. The cam body 172 is attached eccentrically to the top end of the rotation shaft of the motor 171 and contacts the top of the contact plate portion 115.

The cam body 172 is rotated by the drive motor 171. Since the cam body 172 is eccentrically attached to the rotation shaft of the motor 171, the contact plate portion 115 moves up and down. When the contact plate portion 115 is pushed downward, the roller 114 is raised by the lever mechanism and the disc 106 is pushed upward. When the contact plate portion 115 returns upward, the disc 106 is lowered by the spring 111.

FIG. 8 is a perspective view of a drive portion 121b according to a further embodiment. The portion 121b includes a drive motor 175, a drive screw 174, a transmission belt 176 for transmitting rotation from the motor 175 to the drive screw 174, and a support member 173 with a screw hold therethrough.

The drive screw 174 is engaged with the hole of the support member 173. The support member 173 is fixed on the base. The lower end of the drive screw 174 contacts the top of the contact plate portion 115.

When the drive motor 175 rotates, the drive screw 174 rotates and moves downward through the hole of the support member 173. At this time, the contact plate portion 115 is pushed downward and the disc 106 is pushed upward by the lever mechanism. When the drive motor 175 rotates in the opposite direction, the drive screw 174 is raised and the contact plate portion 115 is moved upward. As a result, the disc 106 is returned to the lowered position. At this time, the drive screw 174 may be separated upward from the contact plate portion 115.

Variants may be adopted as the means for elevating and lowering the disc 106 so long as lifting and lowering of the wafer transfer portion 51 is not obstructed.

In addition, the structure of the wafer holding member 107 is not limmited to the above described embodiments. For example, the support protrusions 67 may be formed integrally with the disc 106 as a unitary body.

As described in the foregoing, the wafer transfer apparatus according to the present invention includes (1) a wafer holding means in the wafer transfer portion and (2) means for elevating the wafer holding means. Further, the elevating means includes a drive portion for individually elevating and lowering the wafer holding means during wafer transfer.

Consequently, unlike the prior art apparatus, the wafer transfer portion of the present invention does not move up and down together with the wafer cassette during wafer transfer. Accordingly, it is easy to automate replacement of wafer cassettes. In addition, the means for elevating the wafer holding means is driven only during wafer transfer. Further, the means for elevating the wafer transfer portion is driven only when wafers are stored or taken out from the wafer cassette. As a result, the two elevating means can be operated separately and with independent, simpler constructions.

Although the present invention has been described and illustrated in detail, it is clearly understood that the same is by way of illustration and example only and is not to be taken by way of limitation. The spirit and scope of the present invention should be limited only by the terms of the appended claims.

What is claimed is:

1. An apparatus for storing and transferring a wafer, comprising:

a wafer transfer portion having a path through which a wafer can be transferred;

storing means for storing said wafer, said storing means being removably attached to said wafer transfer portion;

first elevating means for elevating and lowering said wafer transfer portion and said storing means to position said wafer transfer portion and said storing means at a predetermined level;

wafer holding means for temporarily holding said wafer in said wafer transfer portion; and second elevating means for elevating and lowering said wafer holding means, said second elevating means being separate and independent from said first elevating means.

2. The apparatus of claim 1, wherein said wafer holding means includes an upper surface and support protrusions on said upper surface, said support protrusions having ends for holding said wafer.

3. The apparatus of claim 2, wherein said support protrusions consist of three support protrusions.

4. The apparatus of claim 3, wherein said wafer holding means includes a spring for constantly biasing said wafer holding means downward.

5. The apparatus of claim 4, wherein said wafer holding means includes a disc for maintaining said ends of said protrusions at the same height.

6. The apparatus of claim 1, wherein said second elevating means includes a lever mechanism for lifting a lower central portion of said wafer holding means.

7. The apparatus of claim 6, wherein said second elevating means includes an air cylinder.

8. The apparatus of claim 6, wherein said second elevating means includes a motor.

9. The apparatus of claim 1, wherein said first elevating means includes supporting means for horizontally supporting and vertically moving said wafer transfer portion.

10. The apparatus of claim 9, wherein said supporting means includes a pair of guide rods for adjusting the horizontal position of said wafer transfer portion.

11. The apparatus of claim 10, wherein said first elevating means includes a drive screw and drive means for driving said drive screw.

12. The apparatus of claim 11, wherein said first elevating means includes:

a motor for driving said drive screw; and a transmission belt coupling said motor and said drive screw together.

13. The apparatus of claim 1, wherein said storing means includes:

two sides each having an inner surface and an outer surface;

an open side through which said wafer can be fed in a feeding direction and removed; and support means for supporting said wafer in said storing means.

14. The apparatus of claim 13, wherein:

said support means includes a pair of elongated members having upper surfaces at an equal level for supporting said wafer;

said elongated members are fixed to the inner surfaces of said two sides; and said upper surfaces are parallel to said feeding direction.

15. The apparatus of claim 1, wherein said apparatus is for temporarily storing said wafer and for transferring said wafer between a wafer feed apparatus and a wafer discharge apparatus.

* * * * *